(12) United States Patent
Volpe, Jr.

(10) Patent No.: US 6,267,818 B1
(45) Date of Patent: Jul. 31, 2001

(54) SQUEEGEE BLADE ASSEMBLY

(75) Inventor: John Joseph Volpe, Jr., Milford, MA (US)

(73) Assignee: JNJ Industries, Inc., Milford, MA (US)

( * ) Notice: Subject to any disclaimer, the term of this patent is extended or adjusted under 35 U.S.C. 154(b) by 0 days.

(21) Appl. No.: 09/302,548

(22) Filed: Apr. 30, 1999

(51) Int. Cl.$^7$ ....................................................... B05C 11/04
(52) U.S. Cl. .......................... 118/103; 15/256.5; 101/123
(58) Field of Search .................................... 118/103, 119, 118/120, 122, 123, 126, 261; 15/245, 245.1, 256.53; 101/114, 119, 120, 121, 123; 427/272, 282

(56) References Cited

U.S. PATENT DOCUMENTS 4,957,045 * 9/1990 Messerschmitt ..................... 101/123
5,660,632   8/1997 Volpe, Jr. et al. .

* cited by examiner

*Primary Examiner*—Laura Edwards
(74) *Attorney, Agent, or Firm*—George C. Atwell

(57) ABSTRACT

An applicator assembly is provided for depositing various kinds of viscous, spreadable media onto workpieces, such as circuit boards and metal and ceramic substrates, and includes a blade structure having a metal blade portion and a plastic blade portion joined together along one of their respective longitudinal edges. The blade structure is removably attachable to a blade holder and is reversible so that the metal blade can be secured to the blade holder which is mounted to a screen and stencil printer, thus exposing the plastic blade portion for use in screen and stencil printing operations. Alternatively, the blade structure can be secured to the blade holder thereby exposing the metal blade portion for use in screen and stencil printing operations.

8 Claims, 3 Drawing Sheets

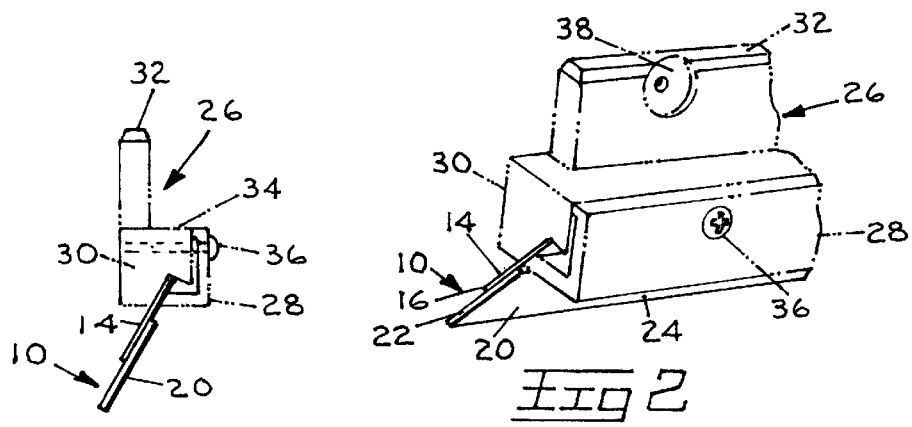
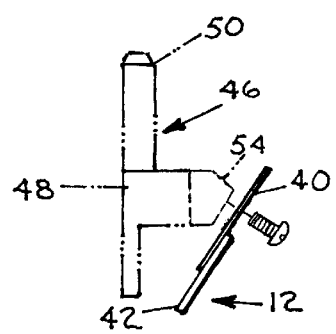
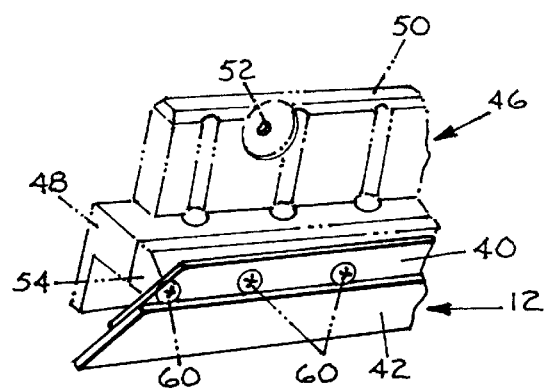
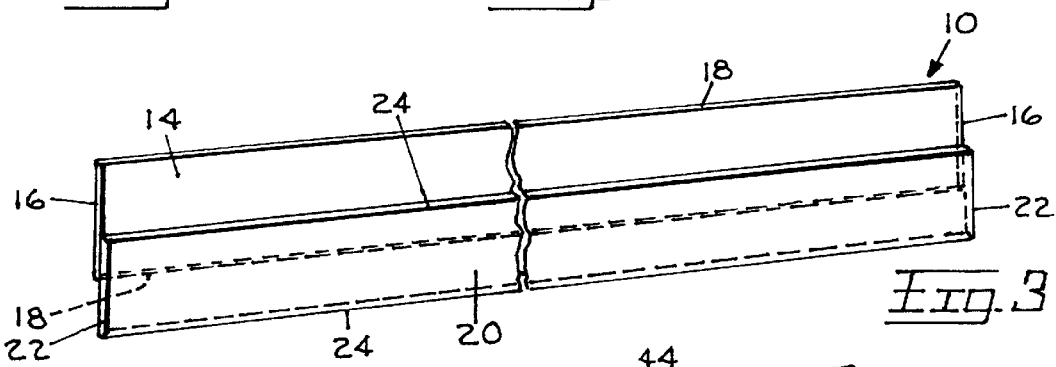
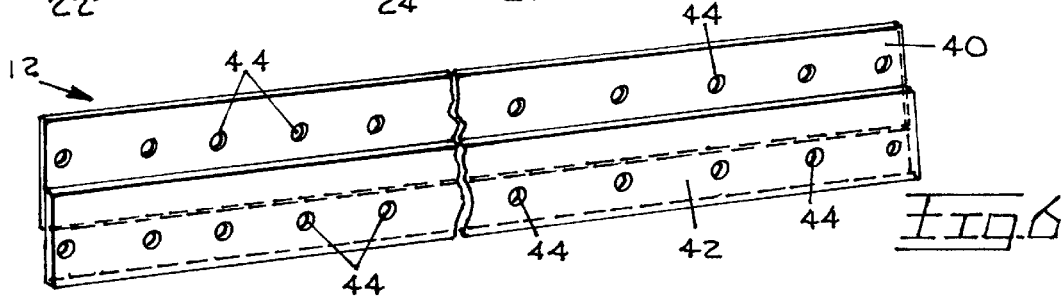

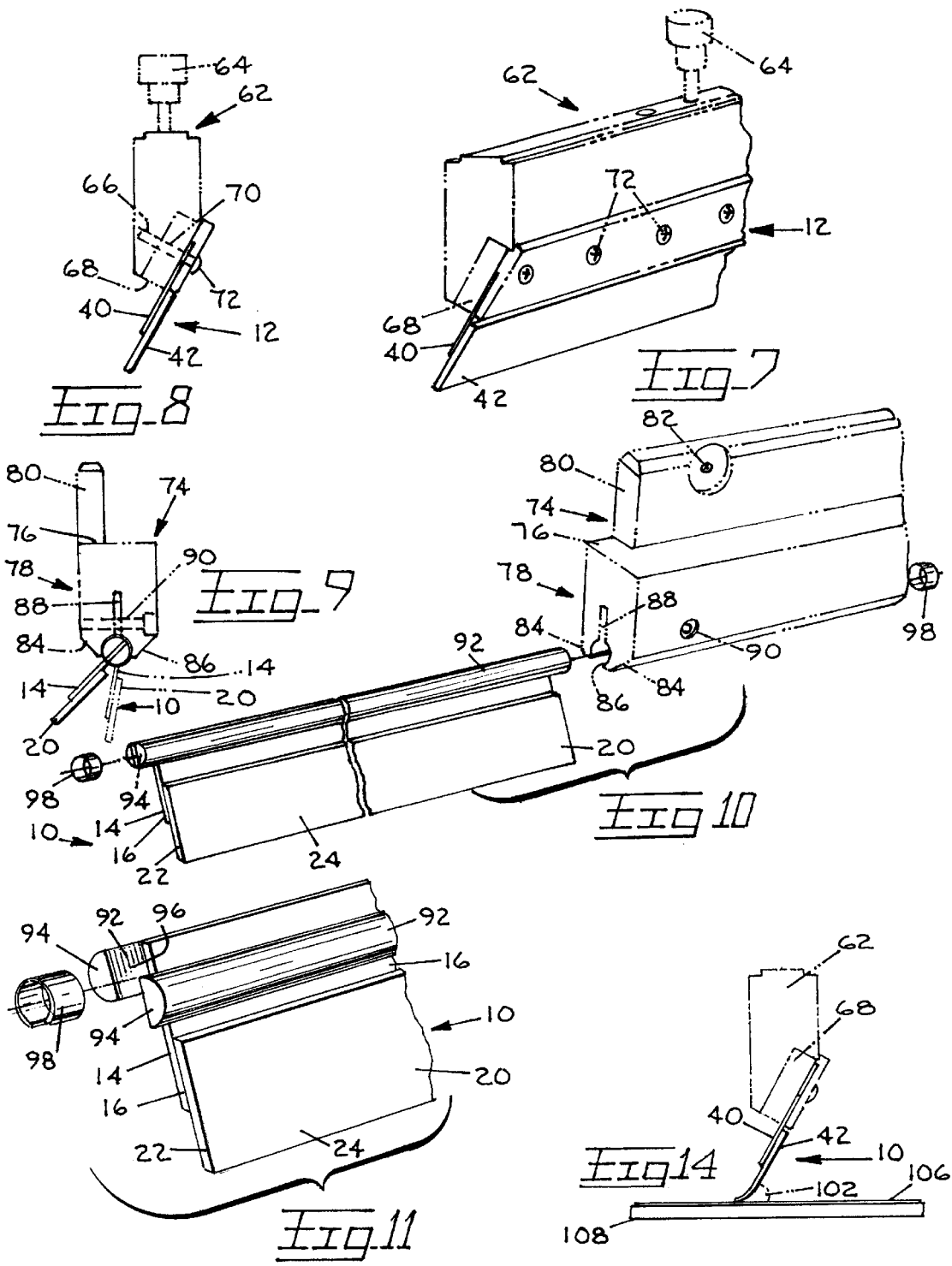

SQUEEGEE BLADE ASSEMBLY

FIELD OF THE INVENTION

The present invention relates generally to blades for spreading and depositing media onto substrates, and, more particularly, pertains to an applicator assembly which includes a reversible squeegee blade for transferring and depositing various kinds of spreadable, viscous media onto a substrate.

In the surface mount technology field and in hybrid microelectronics fields, manual, semiautomatic or automatic screen and stencil printing equipment is used for printing solder paste, adhesives, epoxies (both conductive and adhesive), flux, inks (conductive, resistive, and dielectric), and other spreadable, viscous print media comprising generally paste-like substances, onto printed circuit boards, metal and ceramic substrates, and other types of substrates used in electrical and electronic assemblies.

The circuit board, or other substrate, is supported on the stencil or screen printer, and then one of the above-mentioned materials is transferred through a mask, masking surface or workpiece, such as an open-apertured template, screen or stencil for deposition onto the substrate. The apertures of the masking surface correspond to and are aligned with the areas to be printed on the circuit board, but the masking surface apertures are generally smaller than the areas or lands of the circuit boards. In addition, the above-listed materials can be forced through a cross-sectional screen mesh permeated with an emulsion so that the circuit or pattern to be printed is etched out of the emulsion. The above-described materials are used for the purpose of holding surface-mounted electronic components to the surfaces of the circuit boards and metal and ceramic substrates prior to soldering. Some of the epoxies currently being used are electrically conductive and do not require soldering, but they are deposited onto the various substrates by the above-described process.

The typical screen or stencil printer includes a tooling plate upon which the circuit board is positioned and aligned, a squeegee assembly or squeegee head assembly, and a metal or polyurethane blade referred to in the industry as a squeegee blade. A squeegee blade holder is mounted to the squeegee assembly and both the squeegee blade holder and the squeegee assembly are positioned above, and extend transverse to, the circuit board or other substrate which is horizontally positioned on the tooling plate.

In operation, the squeegee blade is driven down under pressure until it comes into contact with, or is positioned immediately above, the top surface of the screen or stencil.

With the squeegee blade forced down under pressure, the drive assembly drags the squeegee blade across the stencil. For manual screen and stencil printers, the operator manually moves the squeegee assembly in a linear direction above the screen or stencil and the circuit board. As the squeegee blade travels above the stencil, the solder paste—or other material previously described—is dragged and pushed along the top surface of the stencil by the squeegee blade. The squeegee blade pathway is in a linear direction relative to the masking surface and the circuit board, and the squeegee blade can travel in a linear reciprocable path relative to the masking surface and circuit board.

The squeegee blade always travels parallel to the masking surface and not at an angle with respect thereto. The simultaneous downward pressure and forward travel of the squeegee blade against the solder paste forces the paste through the stencil or screen and deposits the solder paste onto the circuit board. The combined downward pressure and longitudinal movement of the blade forces the solder paste through the stencil or screen apertures and in the process wipes clean the surface of the screen or stencil. The bead of solder paste is not dragged across the top surface of the screen or stencil; in fact, the bead of solder paste rolls across the top surface of the screen or stencil like a steamroller traveling over the road surface. The rolling action of the solder paste, caused by simultaneous downward pressure and forward movement of the squeegee blade, causes the paste to be pushed and transferred through the screen or stencil apertures for deposition onto the circuit board. Once the solder paste is transferred through the apertures or interstices of the template, screen or stencil, and deposited on the circuit board, electrical components, such as capacitators and resistors, are mounted onto the wet paste deposited on the circuit board to complete the electrical circuitry of the board. The circuit board then goes through a heating/curing process whereupon the solder paste is transformed into what the industry refers to as pads and lines for creating the electrical circuitry on the circuit board.

DESCRIPTION OF THE PRIOR ART

The majority of squeegee blades currently in use comprise a blade assembly which includes two flat, elongated aluminum or steel plates between which a flat or bent piece of steel (the actual squeegee blade) is sandwiched, leaving a portion of the blade exposed for transferring material onto the substrate. The plates are fastened together for holding the blade in position, and then the entire assembly is inserted into the blade holder. The angle between the squeegee blade and the screen or stencil superposed on the circuit board can be fixed or variable depending upon the type of blade holder to which the assembly is mounted. The above-mentioned angle is referred to in the industry as the "angle of attack", and U.S. Pat. No. 6,660,632 (incorporated herein by reference) discloses a number of different blade holders which permit the adjustment and variability of the angle of attach of the squeegee blade. In addition, some screen and stencil printers include a feature that allows the selective adjustment of the entire squeegee head assembly for varying the blade's angle of attack. This feature is usually not a standard feature on printers but comes as an option and is a separate mechanism from the squeegee assembly.

Among the structures superposed on the circuit boards and metal and ceramic substrates are metal mask stencils, wire mesh and silk-screens, and, as a relatively new development, open aperture plastic mask stencils. Hard metal squeegee blades should not be used for transferring material, such as solder paste or epoxies, through the plastic mask stencils for deposition onto the substrate because the metal squeegee blades will scratch and damage the plastic mask stencils while traveling thereover. In addition, during any given screen printing process, both metal and plastic blades may need to be used but, as disclosed in U.S. Pat. No. 5,660,632, it is not necessarily a quick and easy procedure to move the squeegee head assembly free of the tooling plate of the screen/stencil printer so that one type of squeegee blade can be removed from the squeegee blade holder for replacement by another type of squeegee blade. Moreover, both plastic and metal mask stencils may be used in successive printing operations, and this will require constant changing of squeegee blades in order to mount the appropriate blade for use with the plastic or metal mask stencil.

SUMMARY OF THE INVENTION

The present invention comprehends an applicator assembly including an improved squeegee wiper or blade structure having a metal blade portion and a polymer (plastic) blade portion, and the blade structure being reversible on a squeegee blade holder so that either the plastic blade portion or the metal blade portion can be exposed for a printing operation.

The blade structure includes a first elongated, generally rigid blade portion and a second elongated, flexible blade portion joined to the first blade portion to form a unitary structure. Both blade portions are coequal in length and are joined together along one of their respective longitudinal edges. In order to permit selective adjustment of the blade structure within certain kinds of blade holders, a pair of half circle-shaped retaining rods, between which a lengthwise end of either blade portion is positioned, can be inserted into the blade holder, thus exposing a major part of the other blade portion for use in printing operations. The retaining rods are held together by retaining elements, such as clamps, O-rings or steel springs, disposed onto the ends of the rods whereupon the respective metal or plastic blade portion is securely held between the retaining rods.

It is an objective of the present invention to provide a reversible blade structure which incorporates both metal and polymer (plastic) blade portions.

It is another objective of the present invention to provide a blade structure which can be easily and quickly reversed so that either the metal or plastic blade portion can be exposed for a printing operation while the opposite blade portion is secured to the blade holder.

Yet another objective of the present invention is to provide a blade structure which can be used in conjunction with structural elements that facilitate the selective variability of the blade angle of attach without requiring removal of the blade structure from the blade holder.

These objectives, together with other objects and advantages which will become subsequently apparent, reside in the details of construction and operation as more fully hereinafter described and claimed, reference being had to the accompanying drawings, forming a part hereof, wherein like numerals refer to like parts throughout.

BRIEF DESCRIPTION OF THE DRAWINGS

FIG. 1 is a side elevational view of an applicator assembly showing the metal blade portion mounted to the blade holder and the plastic blade portion joined to the metal blade portion and projecting downwardly from the blade holder;

FIG. 2 is a fragmentary perspective view of the applicator assembly first shown in FIG. 1;

FIG. 3 is a perspective view of the blade structure first shown in FIG. 1,

FIG. 4 is a side elevational view of another type of applicator assembly illustrating the attachment of the metal blade portion to a type of blade holder different from that shown in FIGS. 1 and 2;

FIG. 5 is a fragmentary perspective view of the applicator assembly shown in FIG. 4;

FIG. 6 is a perspective view of an alternate embodiment for the blade structure wherein both the plastic blade portion and the metal blade portion include a plurality of apertures for securement to the blade holder of FIGS. 4 and 5;

FIG. 7 is a fragmentary perspective view of the blade structure first shown in FIG. 6, secured to another type of blade holder;

FIG. 8 is a side elevational view of the blade structure secured to the blade holder first shown in FIG. 7;

FIG. 9 is a side elevational view of another type of applicator assembly including the blade structure first shown in FIG. 1, secured to the blade holder which permits selective adjustment and variability of the blade structure angle of attack;

FIG. 10 is an exploded assembly view of the blade structure and blade holder first shown in FIG. 9;

FIG. 11 is a fragmentary perspective view of the blade structure first shown in FIG. 9, illustrating the elements which facilitate securement of the blade structure to the blade holder and all the selective adjustment of the angle of attack of the blade structure;

FIG. 14 is a side elevational view of the blade structure first shown in FIG. 5, secured to the blade holder of FIGS. 7 and 8, depositing media through the plastic stencil and onto a circuit board.

DETAILED DESCRIPTION OF THE PREFERRED EMBODIMENT

Figure 15:
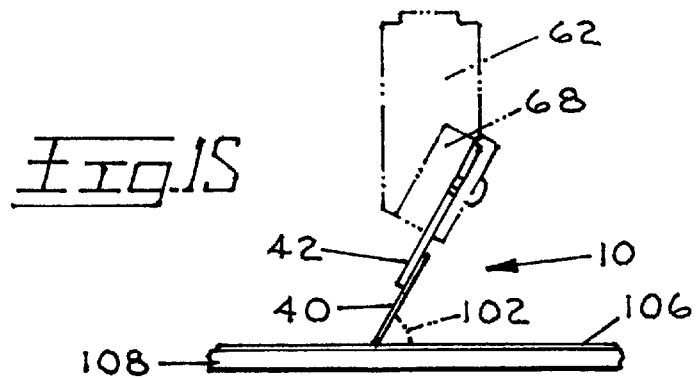
FIG. 15 is a side elevational view of the applicator assembly first shown in FIGS. 7 and 8, illustrating the attachment of the plastic blade portion to the blade holder, thus exposing the metal blade portion for depositing media through a metal mask stencil and onto the circuit board.

Illustrated in FIGS. 1–15 are several embodiments of an applicator assembly or wiper system for depositing media onto a substrate. Specifically, the applicator assemblies of FIGS. 1–15 include a blade holder and squeegee blade structure for transferring and depositing generally spreadable, viscous print media onto various kinds of substrates, such as circuit boards and metal and ceramic substrates, that are used in the surface mount technology field and related electronic and microelectronic fields. The blade structure is used to transfer media, such as solder paste, flux, adhesives and epoxies, through a mask means or masking surfaces, such as wire mesh screens, metal mask stencils and templates, and plastic or polymer screens, stencils, and templates, onto circuit boards, metal and ceramic substrates, and other types of substrates used in electronic assemblies. The blade structure includes a unitary two-in-one reversible blade or wiper that provides the user with flexibility of use by incorporating in one blade structure the ability to transfer any of the above-described media through either metal mask screens, stencils, and templates or plastic (polymer) screens, stencils, and templates. The blade structures of FIGS. 1–15 allow the user to replace his inventory stock of separate metal and plastic squeegee blades with the appropriately-sized, reversible blade structure, thus reducing inventory and maintenance costs.

The blade structure 10 of FIGS. 1–3 and FIGS. 9–15 may be considered the first presently preferred embodiment of the invention, while the blade structure 12 illustrated in FIGS. 4–8 may be considered the second presently preferred embodiment of the invention. However, the differences between the two embodiments reside mainly in the slight changes to the second embodiment that permit its mounting to the particular blade holder shown in FIGS. 4–8. Both embodiments of the squeegee blade structures 10 and 12 can be used with and are removably mountable to a wide variety of squeegee blade holders; a representative selection of squeegee blade holders are shown in FIGS. 1–15, but the blade structures are not thereby limited to these blade holders. All of the squeegee blade holders shown in FIGS. 1–15 are mounted to the cantilevered arms, or other structure, of a squeegee head assembly (not shown) which travels over a tooling plate of a screen or stencil printer as described in said U.S. Pat. No. 5,660,632. The major difference among the blade holders shown in FIGS. 1–15 is that the specific blade holder shown in FIGS. 9–12 permits selective variability or adjustability of the angle of attack of the blade structure relative to the stencil or circuit board over which the blade structure will travel. whereas the blade holders shown in the other figures fix the angle of attack of the blade structure after each blade structure is mounted therein.

Illustrated in FIGS. 1–3 and 9–15 is the first presently preferred embodiment of the reversible blade structure 10 comprising two primary structural elements which may be considered parts or portions of a single or unitary blade when affixed or joined together to create the blade structure 10. The blade structure 10 includes a metal part or portion 14 joined to a plastic part or portion 20. More specifically, the reversible blade structure 10 includes a first elongated blade portion 14 which is generally rectangular in shape and is defined by two opposed short edges 16 and to opposite long edges 18. The blade portion 14 is substantially rigid, although a very minute amount of flexure occurs adjacent the lengthwise portion of the blade portion 14 that is disposed contiguous and adjacent to the screen, stencil or template during the printing operation. The blade portion 14 is the steel or metal blade. In FIGS. 1, 2, and 9–15, blade portion 14 is shown attached or mounted to respective blade holders, whereby blade portion 14 is disposed in the non-use or non-printing position of being submerged, as it were, partially or wholly within the respective blade holder. When blade portion 14 is secured to a blade holder as shown in FIGS. 1 and 2, for example, blade portion 14 does not come in contact with the material or media to be deposited on the circuit board but travels over the stencil or template and circuit board concomitant with the longitudinal—and sometimes reciprocable—movement of the applicator assembly. In addition to blade portion 14, blade structure 10 also includes a second flexible, plastic polymer blade portion 20 that is affixed or attached to blade portion 14. Blade portion 20 also includes a pair of oppositely-disposed, short plastic edges 22 and a pair of oppositely-disposed, long plastic edges 24 perpendicular to edges 22. In order to attach blade portions 14 and 20 together, the sides of blade portions 14 and 20 are pressed together adjacent edges 18 and 24 so that blade portions 14 and 20 slightly overlap one another for secure and stable adhesion. Thus, one long edge 18 or 24 is always presented for a printing operation while the opposite long edge 18 or 24 is mounted to a blade holder. Any of a variety of adhesives can be used to affix blade portions 14 and 20 together; one commonly used adhesive is known by the trademark "LOCTITE."

Illustrated in FIGS. 1–3 is the presently preferred embodiment of the blade structure 10 mounted to a blade holder 26 in which the angle of attack of the blade structure 10 is fixed with respect to a substrate. The blade holder 26 includes an elongated L-shaped frontal member 28; an elongated, block-shaped rear member 30; and an upwardly-projecting portion 32 integrally formed from the rear member 30. Spaced along bodies of members 28 and 30 are a plurality of apertures 34 which are aligned so that fasteners 36 can be inserted therethrough for bringing the members 28 and 30 together. In addition, portion 32 includes a plurality of apertures 38 for attaching blade holder 26 to a squeegee head assembly (not shown). Blade portion 14 of blade structure 10 is inserted between members 28 and 30, and then members 28 and 30 are clamped and held together by inserting fasteners 36 through the aligned apertures 34. The fasteners 36 are then tightened down upon the member 28, thus drawing members 28 and 30 together and causing blade portion 14 to be clamped and held therebetween and exposing blade portion 20 for use in the printing operation. As clearly illustrated in FIGS. 1 and 2, the angle of attack of the entire blade structure 10 is fixed once members 28 and 30 are secured together. In order to reverse blade portions 14 and 20, the fasteners 36 are simply loosened, which causes members 28 and 30 to draw apart far enough to remove the blade structure 10. Then blade structure 10 is manually reversed whereupon blade portion 20 is inserted between members 28 and 30. The fasteners 36 are again tightened, drawing members 28 and 30 together, thereby clamping and holding blade portion 20 to blade holder 26 and exposing blade portion 14 for use. Screen and stencil machine operators can simply and quickly perform this operation of reversing the blade structure 10.

FIGS. 4–6 illustrate an alternate presently preferred embodiment for the applicator assembly. The reversible blade structure 12 shown in FIGS. 4–6 includes a first metal blade part or portion 40 and a second plastic blade part or portion 42, and apertures 44 for each portion 40 and 42 are aligned in pairs. The blade structure 12 shown in FIGS. 4–6 is designed for mounting to a blade holder 46 shown in FIGS. 4 and 5. Blade holder 46 includes an elongated, main structural member or body 48 which includes an integrally-formed, upwardly-projecting portion 50 having apertures or slots 52 spaced thereon for attaching the blade holder 46 to a squeegee head assembly (not shown). The blade holder 46 also includes a forwardly-projecting head portion 54 coextensive with the main body 48 of the blade holder 46. In order to secure the blade structure 12 of FIGS. 4–6 to the blade holder 46, either the blade portion 40 is disposed contiguous to the portion 54 so that the apertures 44 of the blade portion 40 are aligned with apertures (not shown) on the head portion 54, or the blade structure 12 can be flipped over or reversed so that apertures 44 of blade portion 42 are aligned with the apertures on head portion 54. Fasteners 60 are then inserted through either portion 40 or 42, as the case may, and into the apertures or slots of the forwardly-projecting portion 54 whereupon the fasteners 60 pass through the apertures 44 of either portion 40 or 42 for insertion into the slots (not shown) of the main body 48. The fasteners 60 are tightened down and clamp or hold the entire blade structure 12 to the blade holder 46. In order to reverse the blade structure 12 of FIGS. 4–6, the machine operator completely withdraws the fasteners 60 from the blade holder 46 and then simply manually flips the blade structure 12 over so that the plastic blade portion 42 can be placed contiguous to the portion 54, and the metal blade portion 40 can be exposed for a printing operation. This arrangement is opposite that of FIGS. 4 and 5 wherein the metal portion 40 is directly fastened to the blade holder 46, thus exposing the plastic portion 42 for use in a printing operation.

FIGS. 7 and 8 illustrate another embodiment of an applicator assembly which includes the blade structure 12 shown in FIGS. 4–6 mounted to another type of fixed angle of attack blade holder. The blade holder 62 of FIGS. 7 and 8 is an elongated, unitary structure that includes one or more upwardly-projecting knobs 64 for securing the blade holder 62 to the cantilevered arm of the squeegee head assembly (not shown). The blade holder 62 also includes a plurality of spaced-apart slots or apertures 66. An elongated, generally rectangular-shaped, plastic or steel spacer 68 is placed in the lower recessed portion of the blade holder 62 and is generally coextensive in length therewith. The spacer 68 is placed therein when using blade holder 62 with a squeegee blade that was not primarily designed or intended for blade holder 62. The spacer 68 includes a plurality of spaced-apart apertures 70 along its length which align with the slots 66 of the holder 62 for receiving fasteners 72 that are inserted through the apertures 44 of either portion 40 or 42. As shown in FIGS. 7 and 8, the metal portion 40 is mounted directly to the blade holder 62, thus exposing the plastic portion 42 for use in the printing operation. Again, it is a relatively simple and easy matter to reverse blade portions 40 and 42 by simply removing the fasteners 72 from the blade holder 62 and spacer 68 so that the blade structure 12 can be flipped over or reversed thereby allowing the machine operator to secure the plastic portion 42 directly to the blade holder 62 and exposing the metal portion 40 for use.

FIGS. 9–12 illustrate an applicator assembly which utilizes the reversible blade structure 10 shown in FIGS. 1–3 for adjustably mounting the blade structure 10 to a blade holder. Blade holder 74 for the applicator assembly of FIGS. 9–12 includes an elongated main body 78 and an integrally-attached, upwardly-projecting portion 80. The upwardly-projecting portion 80 includes at least two spaced-apart apertures or slots 82 for attaching the blade holder 74 to a squeegee head assembly (not shown). The lower portion 78 of the blade holder 74 includes a pair of oppositely-disposed, elongated, lower lips or flanges 84 coequal in length with the main body member 76. The oppositely-disposed flanges 84 define an elongated, generally circular-shaped channel or groove 86 that communicates with an elongated, rectangular-shaped slot 88 that extends slightly up into the main body member 76 and is coequal in length therewith. As shown in FIGS. 9 and 10, several fastener slots 90 extend through the body 76 of the blade holder 74 and register with and extend through the rectangular-shaped slot 88. Fasteners (not shown) are inserted through the fastener slots 90 and as the fasteners are tightened, the lips or flanges 84 are drawn together, thus clamping down upon any element, such as the metal or plastic portions of blade structures 10 or 12, which may be inserted into the lower channel 86.

The applicator assembly of FIGS. 9–12 includes structural elements specifically adapted for the blade holder 74 and which facilitate the mounting of the blade structure 10 thereto. More specifically, the means for mounting the blade structure 10 to the blade holder 74 comprises a pair of elongated half-circle or semicircular-shaped retaining rods or split bars 92 manufactured from steel or aluminum. The rods 92 are approximately equal in length to the channel 86 of the blade holder 74 and fit snugly therein. Each bar 92 has opposed flat ends 94 and a flat receiving surface 96 coequal in length with the respective bar 92 and, when both bars 92 are inserted into the channel 86, the flat receiving surfaces 96 are positioned in opposed parallel relationship to each other and are spaced slightly from each other. Either the metal portion or the plastic portion of blade structure 10 can be disposed between and contiguous to the surface 96 of each bar 92.

Figure 12:
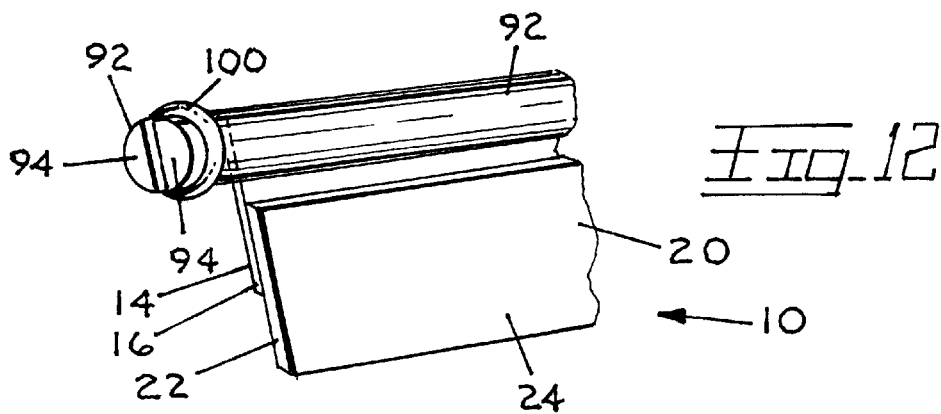
FIG. 12 is a fragmentary perspective view of the blade structure first shown in FIG. 9, illustrating the securement of the blade structure to the retaining rods.

In order to hold the bars 92 together in spaced parallel alignment within the channel 86, and also to clamp either the metal or plastic portion of blade structure 10 therebetween, a removably-attachable blade structure retaining means is utilized. Two embodiments for the blade retaining means are shown in FIGS. 10–12. The blade retaining means shown in FIGS. 10 and 11 includes a pair of flexible steel springs 98, one spring 98 on each end of each bar 92. After the respective portion of the blade structure 10 is disposed between the surfaces 96, the respective springs 98 are slipped onto the ends 94. Each spring 98 is manufactured from a light-gauge steel and has a smaller diameter than the bars 92 so that, when the springs 98 are slipped onto the end 94, the bars 92 are clamped securely together. FIG. 12 illustrates a second embodiment for the blade retaining means which includes pair of O-rings 100, one of which is disposed onto each end 94 for securely clamping and holding the bars 92 together with the metal portion 14 of blade structure 10 inserted therebetween so that the plastic portion 20 can be exposed for a printing operation. The O-rings 100 also have a smaller diameter than the bars 92 so that when either the metal portion 14 or the plastic portion 20 of blade structure 10 is disposed therebetween, each 0-ring 100 is snugly slipped over each opposite end 94 for securely clamping the blade structure 10 therebetween.

The blade holder 74 illustrated in FIGS. 9 and 10 permits the angle of attack of the blade structure 10 to be selectively varied or adjusted dependent upon the type of media and substrate used in that respective printing operation. The angle of attack of the blade structure 10 can be adjusted after the structure 10 is secured to the bars 92 by the springs 98 or O-rings 100 by simply loosening the fasteners, which action causes the flanges 84 to slightly draw apart. Once the flanges 84 have been drawn apart far enough to allow the bars 92 to move, bars 92 can be rotated within the channel 86 for adjusting the angle of attack of the blade structure 10. Two common angles of attack for the blade structure 10 of the presently preferred embodiment of the invention, or, for that matter, for the majority of squeegee blades, are 30 degrees and 45 degrees relative to the horizontal extension of the masking surface. Blade structure 10, when disposed in the blade holder 74 by the bars 92 shown in FIGS. 9–12, is manually adjustable to these two common angles of attack as well as any angle therebetween. However, there are blade holders available which allow a greater freedom of adjustability to achieve a greater angle of attack by the squeegee blade with respect to the surface or substrate over which the squeegee blade will travel, and blade structures 10 and 12 can be used with those blade holders.

The plastic portions 20 and 42 of blade structures 10 and 12 are less harmful to certain open-apertured, plastic-type stencils that are relatively new to the market and that are used for transferring various media, such as various epoxies and adhesives, onto circuit boards and metal and ceramic substrates in the electrical and electronic assemblies of the electronic, microelectronic, and surface mount technology fields. Unlike metal portions 14 and 40, the thin, flexible plastic portions 20 and 42 will not scratch or mar the surface of the plastic screen, stencil or template.

Figure 13:
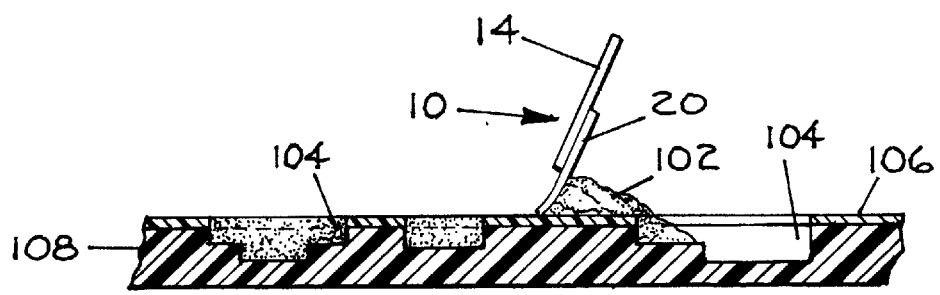
FIG. 13 is an enlarged, sectioned elevational view illustrating the deposition of media through the apertures of a plastic stencil and onto a circuit board by the plastic blade portion of the blade structure first shown in FIG. 1.

FIGS. 13–15 illustrate, in a general way, the transfer and deposition of media onto a circuit board by the afore-described applicator assemblies. FIG. 13 shows the plastic portion 20 transferring and depositing media, such as an epoxy or adhesive 102, through the apertures 104 of a plastic stencil 106 and onto a circuit board 108. The plastic portion 20 of blade structure 12 flexes slightly as it travels along and over the stencil 106. The plastic portion 20 provides a shear force at the apertures 104 in order to achieve the same type of printing results as use of the metal portion 14; however, the plastic portion 20 is far better suited for use with screens or stencils made from various polymers or plastics because the plastic screens or stencils will not be scratched or damaged during the printing operation, and the plastic portions 20 and 42 will perform with all of the same characteristics as the metal portions 14 and 40.

FIGS. 14 and 15 illustrate the use of the metal portion 40 and the plastic portion 42 of the blade structure 12 shown in FIGS. 7 and 8 transferring media, such as epoxy or adhesives 102, through the apertures (not shown) of a metal screen or stencil 110 and onto the circuit board 108. The metal portions 14 and 40 provide the ability to print media, such as solder paste, flux, and epoxies, through a metal mask stencil or wire mesh screen. The hard metal edges of metal portions 14 and 40 provide a strong shear force at and along the surfaces of the apertures of the stencil 110 so that the solder paste, epoxies, and adhesives 102 can be transferred through the stencil 110 for deposition onto the circuit board 108. The stiffness or rigidity of the metal portions 14 and 40 wipes the upper surface of the stencil 110 clean and, therefore, leaves little or no print media residue on the upper surface of the stencil 110. In addition, the hardness of the metal portions 14 and 40 prevents them from penetrating down into the apertures of the stencil 110 as the metal portions 14 and 40 travel along and above the upper surface of the stencil 110. This prevents any scavaging of the media, such as the solder paste, epoxy or adhesive 102, leaving solder pad deposits on the circuit board 108 with flat and uniform tops that resemble a brick.

The foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to, falling within the scope of the invention.

What is claimed is:

1. Apparatus for depositing a paste substance onto a circuit board, comprising:
   a blade holder mounted adjacent to the circuit board and disposed parallel therewith for selective longitudinal movement thereto so that the paste substance can be deposited onto the circuit board;
   a reversible unitary blade structure for securement to the blade holder having an elongated, substantially rigid metal portion and an elongated flexible plastic portion joined to the substantially rigid portion, the metal and plastic portions for selectively contacting the paste substance and depositing the paste substance onto the circuit board; and
   means for mounting the unitary blade structure to the blade holder the means for mounting including a pair of semicircular-shaped retaining rods removably secured to the blade holder, the means for mounting allowing the reversible displacement of the blade structure whereby either the metal or plastic portion can be selectively secured to the means for mounting, thus exposing the other portion for depositing the paste substance onto the circuit board.

2. The apparatus of claim 1 wherein each retaining rod includes a flat receiving surface, and the flat receiving surfaces of both retaining rods are disposed in opposed parallel relationship to each other when the retaining rods are mounted to the blade holder.

3. The apparatus of claim 2 wherein the retaining rods are selectively rotatable within the blade holder for changing the angularity of the blade structure relative to the workpiece.

4. The apparatus of claim 3 wherein the rigid metal portion is mounted between the flat receiving surfaces of the rods and then the rods are mounted to the blade holder, thus exposing the flexible plastic portion for depositing the paste substance onto the circuit board.

5. The apparatus of claim 4 wherein the flexible plastic portion is mounted between the flat receiving surfaces of the retaining rods and then the retaining rods are mounted to the blade holder, thus exposing the rigid metal portion for depositing the paste substance onto the circuit board.

6. The apparatus of claim 5 further comprising a blade retaining means removably attachable to the ends of both retaining rods so that either the respective metal portion or plastic portion is securely held between the retaining rods after the rods are mounted to the blade holder, and the blade retaining means are attached to the ends of the rods to clamp the rods together.

7. The apparatus of claim 6 wherein the blade retaining means includes a pair of flexible springs for mounting to the retaining rods, with one spring disposed onto each opposite end of each retaining rod for holding the retaining rods together and clamping and holding either the metal or plastic portion therebetween so that the blade structure can be mounted to the blade holder thereby exposing the other portion for depositing the paste substance onto the circuit board.

8. An applicator assembly for depositing a paste substance through apertured mask surfaces, such as screens, stencils or templates, onto a circuit board, comprising:
   a blade holder mounted adjacent to a mask surface for moving in a linearly reciprocal pathway relative to the mask surface and circuit board;
   a unitary, elongated reversible blade structure removably securable to the blade holder and having a first substantially rigid metal portion and a second flexible plastic portion joined to the metal portion whereupon either the first or second portion is mounted to the blade holder so that the other portion is disposed parallel to the mask surface for depositing the paste substance through apertures of the mask surface and onto the circuit board; and
   the rigid metal portion and the flexible plastic portion being overlapped to form jointure therebetween and wherein the rigid metal portion and the flexible plastic portion each have a linear arrangement of spaced-apart apertures to accommodate fasteners in attaching the blade structure to the blade holder.

* * * * *